(12) United States Patent  
Barabash et al.

(10) Patent No.: US 9,012,260 B2  
(45) Date of Patent: Apr. 21, 2015

(54) CONTROLLING RERAM FORMING VOLTAGE WITH DOPING

(71) Applicant: Intermolecular, Inc., San Jose, CA (US)

(72) Inventors: Sergey Barabash, San Jose, CA (US); Charlene Chen, San Jose, CA (US); Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/527,276

(22) Filed: Oct. 29, 2014

(65) Prior Publication Data

US 2015/0064873 A1 Mar. 5, 2015

Related U.S. Application Data

(63) Continuation of application No. 13/719,051, filed on Dec. 18, 2012, now Pat. No. 8,907,313.

(51) Int. Cl.
*H01L 29/82* (2006.01)
*H01L 45/00* (2006.01)

(52) U.S. Cl.
CPC .......... *H01L 45/1616* (2013.01); *H01L 45/146* (2013.01); *H01L 45/1253* (2013.01); *H01L 45/1641* (2013.01); *H01L 45/08* (2013.01)

(58) Field of Classification Search
CPC .......... H01L 45/04; H01L 29/00; H01L 27/24; G11C 13/0004
USPC ................. 257/1–5, E29.002; 438/102–104
See application file for complete search history.

(56) References Cited

U.S. PATENT DOCUMENTS

2012/0217461 A1* 8/2012 Kobayashi et al. ............... 257/2

OTHER PUBLICATIONS

"Electron Work Function of the Elements" in CRC Handbook of Chemistry and Physics, Internet Version 2007, (92nd edition), David R. Lide, ed., Taylor and Francis, Boca Raton FL.*

* cited by examiner

*Primary Examiner* — Jami M Valentine

(57) ABSTRACT

An internal electrical field in a resistive memory element can be formed to reduce the forming voltage. The internal electric field can be formed by incorporating one or more charged layers within the switching dielectric layer of the resistive memory element. The charged layers can include adjacent charge layers to form dipole layers. The charged layers can be formed at or near the interface of the switching dielectric layer with an electrode layer. Further, the charged layer can be oriented with lower valence substitution side towards lower work function electrode, and higher valence substitution side towards higher work function electrode.

19 Claims, 19 Drawing Sheets

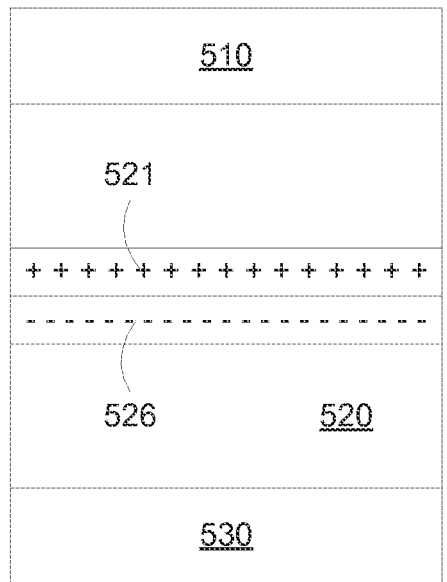
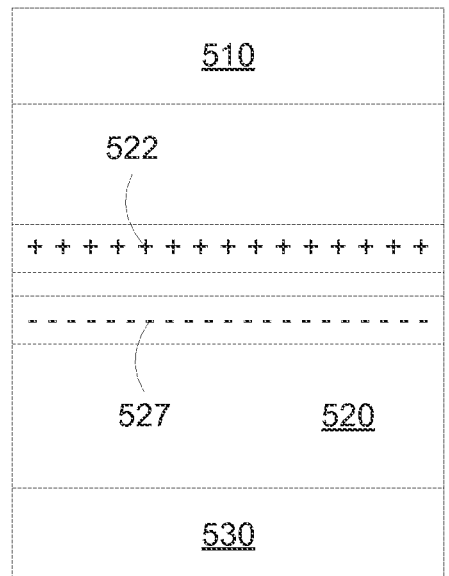
FIG. 5A  FIG. 5B
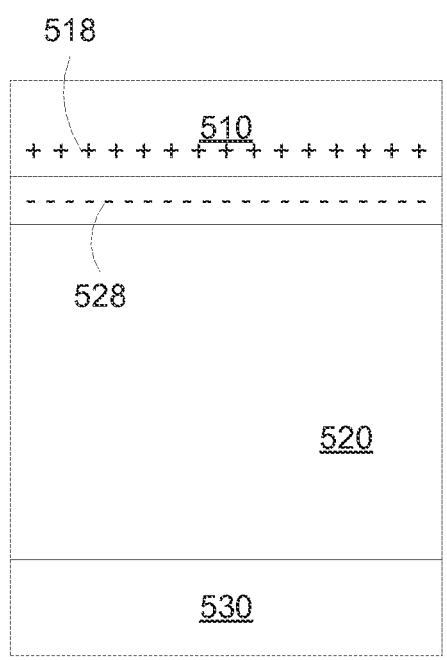
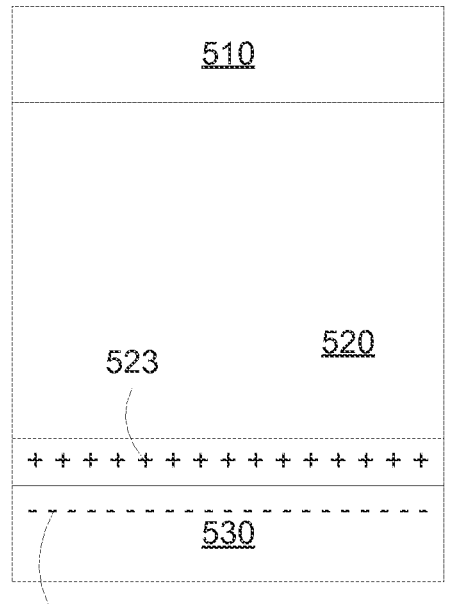
FIG. 5C  FIG. 5D

CONTROLLING RERAM FORMING VOLTAGE WITH DOPING

CROSS-REFERENCE TO RELATED APPLICATIONS

This is a Continuation application of U.S. patent application Ser. No. 13/719,051, filed on Dec. 18, 2012, which is herein incorporated by reference for all purposes.

FIELD OF THE INVENTION

This invention relates generally to nonvolatile memory elements, and more particularly, to methods for forming resistive switching memory elements used in nonvolatile memory devices

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive memory device, e.g., resistive switching nonvolatile random access memory (ReRAM) is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

The voltage and current required to initially form conducting filaments in a ReRAM device is typically higher than that required for subsequent switching, leading to substantial power consumption during the forming process.

Therefore, there is a need for a resistive memory structure that can meet the design criteria for advanced memory devices.

SUMMARY

In some embodiments, an internal electrical field in the ReRAM stack is formed to reduce the forming voltage. The forming voltage can be reduced to match the operating voltages of controlling circuits, decreasing the power consumption.

In some embodiments, a dipole layer can be formed within the switching dielectric layer of the ReRAM stack, for example, during the deposition of the switching dielectric layer. The dipole layer can create a net dipole moment within the switching layer, which can reduce the forming voltage of the ReRAM device. The dipole layer can be formed by replacing or adding a cation layer of the switching dielectric layer with a lower valence element, or by replacing or adding an anion layer of the switching dielectric layer with a higher valence element.

In some embodiments, a charge layer can be formed at or near the interface of the switching dielectric layer with an electrode layer. The charge layer can induce an image charge layer at the electrode, creating a net dipole moment, which can reduce the forming voltage of the RRAM device. The charge layer can be formed by replacing or adding a cation layer of the switching dielectric layer with a lower valence element, or by replacing or adding an anion layer of the switching dielectric layer with a higher valence element.

In some embodiments, the forming voltage can be further reduced by using electrodes having different work function, together with forming dipole layers within the switching dielectric layer and/or charge layers at or near the interface of the switching dielectric layer with an electrode layer. A negatively charged layer can be formed by replacing or adding a cation layer of the switching dielectric layer near the higher work function electrode with a lower valence element. Alternatively, a negatively charged layer can be formed by replacing or adding an anion layer of the switching dielectric layer near the higher work function electrode with a lower valence element. Similarly, a positively charged layer can be formed by replacing or adding an anion layer of the switching dielectric layer near the lower work function electrode with a higher valence element. Further, the dipole layer can be oriented, for example, with lower valence substitution side towards lower work function electrode, and higher valence substitution side towards higher work function electrode.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 5A-5D illustrate memory devices with dipole layers according to some embodiments.

DETAILED DESCRIPTION

Figure 1A:
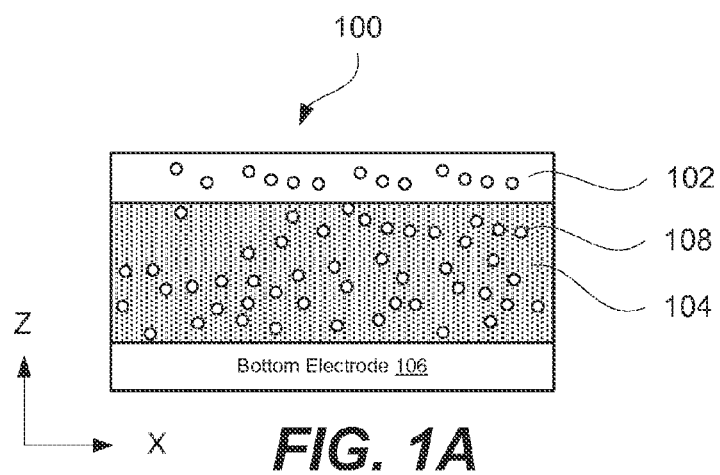
FIGS. 1A-1C illustrate a schematic representation of a ReRAM operation according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The voltage required to initially form bistable states, e.g., in the form of conducting filaments, in a resistive random access memory (ReRAM) device is typically higher than that required for subsequent switching between the bistable states. Due to high currents during forming, the high forming voltage leads to substantial power consumption during the forming process.

In some embodiments, ReRAM device design is provided that can substantially reduce the forming voltage, which can lead to power consumption reduction and a better match to the operating voltages of controlling circuits.

In some embodiments, ReRAM device design is provided that has a built-in electric field in the memory stack. The built-in field can have a same polarity as the applied forming voltage, thus can assist in reducing the forming voltage level.

In some embodiments, the built-in field can be created by having electrodes with different work functions. For example, one electrode could be a high-work function material (such as Pt, Au, Ag, W, $MoO_2$, $MoSi_xO_y$, etc.). The other electrode could be a moderate-work-function material (such as TiN, Al, etc.) or a low-work-function material (such as Mg, Hf, Zr, Eu, La, their alloys, etc.). Alternatively, one electrode could be a moderate-work-function material and the other could be a low-work-function material. In general, high work function difference can strongly assist in reducing the forming voltage. Other material and process considerations can also influence the electrode selection, such as the composition and properties of the switching dielectric layer.

In some embodiments, the built-in field can be created by having dipole layers in the switching dielectric layer of the memory device. For example, by replacing or alloying cations in the dielectric layer, e.g., Hf in a $HfO_2$ dielectric layer, with a lower valence element, such as Mg, Al, Ca, Y, Lu, Eu, Yb, a negatively charged layer can be generated. Alternatively, anions in the dielectric layer, e.g., oxygen in a $HfO_2$ dielectric layer, can be replaced with a lower or higher valence element, e.g., nitrogen or fluorine, to form a negatively or positively charged layer, respectively. Two oppositely charged layers can be placed next to each other to form a dipole layer, which can generate a built-in electric field. A charge layer can be placed at the interface of the dielectric layer with the electrode, inducing an opposite charge layer in the electrode, to also form a dipole layer.

During forming, a voltage is applied to the memory stack, where the positive/negative voltage is applied relative to the negative/positive charge layers and/or high/low work function electrodes. The conductive filaments in the memory element can be generated under the influence of a combination of the built-in electric field and the applied voltage. The forming voltage requirement can be reduced by an amount proportional to the built-in field.

The above description uses forming voltage reduction as an example. But the built-in electric field can also be used for reducing other applied voltages, such as set or reset voltages of the memory device.

A ReRAM cell exhibiting resistive switching characteristics generally includes multiple layers formed into a stack. The structure of this stack is sometimes described as a Metal-Insulator-Metal (MIM) structure. Specifically, the stack includes two conductive layers operating as electrodes. These layers may include metals and/or other conductive materials. The stack also includes an insulator layer disposed in between the electrode. The insulator layer exhibits resistive switching properties characterized by different resistive states of the material forming this layer. As such, this insulator layer is often referred to as a resistive switching layer. These resistive states may be used to represent one or more bits of information. The resistance switching properties of the insulator layer are believed to depend on various defects' presence and distribution inside this layer. For example, different distribution of oxygen vacancies in the layer may reflect different resistance states of the layer, and these states may be sufficiently stable for memory application.

To achieve a certain concentration of defects in the resistance switching layer, the layer has been conventionally deposited with defects already present in the layer, i.e., with preformed defects. In other words, defects are introduced into the layer during its formation. For example, tightly controlled Atomic Layer Deposition (ALD), Physical Vapor Deposition (PVD), or some other low-temperature process to remain within a Back End of Line (BEOL) thermal budget may be used to deposit the insulator layer of the stack. It may be difficult to precisely and repeatedly control formation of these defects particularly in very thin resistance switching layers (e.g., less than 100 Angstroms). For example, when ALD is used to form resistance switching layers, some unreacted precursors may leave carbon-containing residues that impact resistance characteristics of the deposition layers and ReRAM cells including these layers. Furthermore, achieving precise partial saturation repeatedly may be very difficult if possible at all. In the case of PVD, sputtering targets tend to wear out influencing the deposition rates and creating variation in resulting resistance switching layers.

Methods of forming nonvolatile memory elements can involve transferring oxygen from precursor layers (used to form or, more specifically, converted into resistance switching layers) to electrodes during annealing of the stacks. The annealing environment may include some hydrogen to control distribution of oxygen within the annealed structure.

As stated above, oxygen diffusion from the precursor layer into the electrode converts the precursor layer into a resistance switching layer. The precursor layer may include a stoichiometric oxide or near-stoichiometric oxide that cannot function as a resistance switching layer until oxygen vacancies or some other defects are formed within that layer. The metal of this oxide may be more electronegative than the metal of the electrode used to trap the oxygen diffused out of the precursor level. The electrode may have substantially no oxygen at least prior to the oxygen transfer but may form an oxide during annealing.

The stack may have a reactive electrode that receives some oxygen during annealing and inert electrode that generally does not participate in oxygen transfer. The inert electrode may be also referred to as an oxygen-resistant electrode and may be made from titanium nitride, tantalum nitride, platinum, gold, and the like. Other suitable materials for inert electrodes include various conductive oxide, such as iridium oxide and ruthenium oxide. In some embodiments, the inert electrode includes an oxide sub-layer facing the resistance switching layer. The rest of the electrode may be formed by the metal of this oxide and may be generally free of oxygen. For example, an initial structure may be fabricated from a metal and then pretreated to form an oxide layer resulting in an inert electrode. This electrode then receives a precursor layer and another reactive electrode formed over the precursor layer. During subsequent annealing, the inert electrode does not experience any significant oxygen transfer, while the reactive electrode receives oxygen from the precursor layer that is converted into the resistive switching oxide layer as it loses oxygen.

If an inert electrode with a protective oxide layer is a first formed electrode in the stack (i.e., the bottom electrode), then it can be first deposited as a metal layer followed by a short low-temperature anneal in oxygen. On the other hand, if an inert electrode is the last electrode formed in the stack (i.e., the top electrode), then its deposition can be initiated in the oxygen environment (e.g., sputtering in an oxygen-containing plasma) to form an initial oxide sub-layer followed by deposition in an inert environment to form the remaining metal (and oxygen free) portion of the electrode.

A reactive electrode can made from a material that reacts with oxygen to form a non-conductive oxide. Some examples of suitable materials include aluminum, titanium, tantalum, chromium, praseodymium, molybdenum, tungsten, and niobium.

A precursor layer may be made from materials, such as tantalum oxide ($Ta_2O_5$), niobium oxide ($Nb_2O_5$), titanium oxide ($TiO_2$), hafnium oxide ($HfO_2$), strontium titanate ($SrTiO_3$), or other suitable transition metal oxides, perovskite manganites, or rare earth oxides. The precursor layer may include a stoichiometric oxide or near-stoichiometric oxide. For example, oxygen vacancies in the precursor layer may have a concentration of less than 0.1 atomic percent prior to its annealing.

Annealing may be performed on a fully formed stack including two electrodes and precursor layer or a partially formed stack that includes only one electrode (the second electrode is formed after the annealing). Other types of layers may also be present in these stacks. As stated above, annealing performed at relative mild conditions to achieve better control over oxygen diffusion between one or more reactive layers and precursor layer. Annealing may form a graded composition of oxygen vacancies in the precursor layer.

The resistive switching layer changes its resistive state when a certain switching voltage (e.g., a set voltage or a reset voltage) is applied to this layer as further explained below. The applied voltage causes localized heating within the layer and/or at one of both of its interfaces with other components. Without being restricted to any particular theory, it is believed that a combination of the electrical field and localized heating (both created by the applied voltage) causes formation and breakage of various conductive paths within the resistive switching layer and/or at its interfaces. These conductive paths may be established and broken by moving defects (e.g., oxygen vacancies) within the resistive switching layer and through one or more interfaces that resistive switching layer forms with adjacent layers.

The interfaces can be inert interfaces or reactive interfaces. The inert interface generally does not have any substantial defect transfer through this interface. While the defects may be present within one or both layers forming this interface, these defects are not exchanged through the inert interface when switching, reading, or other types of voltages are applied to the ReRAM cell. The reactive interface generally experiences a transfer of defects through this interface. When a resistive switching layer includes an oxygen containing material, such as metal oxides, the reactive interface is formed by an oxygen reactive material, such as titanium. The inert interface may be formed by a material that is not oxygen reactive, which may be a part of an electrode or a diffusion barrier layer. In some embodiments, the flux of defects through the reactive interface is at two or more orders of magnitude greater than the flux of defects through the inert interface. As such, the "inert" and "reactive" naming convention is relative.

The inert interface provides a control for the resistive switching layer while defects are moved in and out of the resistive switching layer through the reactive interface. For example, when a switching voltage is applied to the resistive switching layer in order to reduce its resistance, the reactive interface allows defects to flow into the layer. The defects are typically driven by the electrical potential applied to the layer and form conductive paths through the layer. The direction of this flow may be determined by the polarity of the switching voltage and/or by the electrical charge of the defects (e.g., positive charged oxygen vacancies). At the same time, the second inert interface prevents defects from escaping the layer despite the driving potential. If both interfaces are reactive and allow defects to pass through, then the resistive switching layer may gain defects at one interface and loose at another. In this situation, the layer may never be able to gain enough defects to form conductive paths.

The above scenario is applicable in a very similar manner to a resetting operation during which the resistive switching layer is brought to its high resistance state. When a switching voltage is applied to the layer in order to increase its resistance of the layer, the reactive interface allows defects to flow out of the layer. The defects may also be driven by the electrical potential applied to the layer as described above. The loss of defects may eventually break conductive paths in the layer. At the same time, the second inert interface prevents defects from entering the layer despite the driving potential. If both interfaces are reactive and allow defects to pass through during the resetting operation, then the resistive switching layer may gain defects at one interface and loose at another. In this situation, the layer may never be able to lose enough defects in order to break it conductive paths. It should be noted that defects are often mobile in many times of resistive switching materials.

The ability of an interface to block defects (as in the inert interface) or to allow defects to diffuse through the interface (as in the reactive interface) depends on properties of a layer forming this interface together with the resistive switching layer. Often conductive electrodes are used to form both reactive and inert interfaces. These electrodes may be referred to as reactive and inert electrodes and materials used to form these electrodes may be referred to as reactive and inert materials. It should be noted that this terminology (i.e., reactive and inert) refers to primarily to defect mobility properties of the interfaces. Some examples of inert electrode materials include doped polysilicon, platinum, ruthenium oxide, gold, iridium, coppers, silver, and tungsten. Examples of reactive electrode materials include titanium. Furthermore, some materials may be defined as semi-inert including tantalum nitride, tantalum silicon nitride, and tungsten silicon nitride. In the context of oxygen containing resistive switching materials, such as metal oxides, reactive materials may be also referred to as oxygen reaction materials since oxygen or oxygen vacancies are exchanged through the reactive interface. Titanium is one example of oxygen reactive materials, however other examples may be used as well.

A brief description of ReRAM cells and their switching mechanisms are provided for better understanding of various features and structures associated with methods of forming nonvolatile memory elements further described below. ReRAM is a non-volatile memory type that includes dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

Figure 1B:
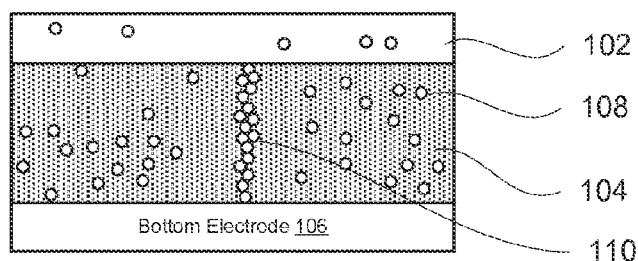
Figure 1C:
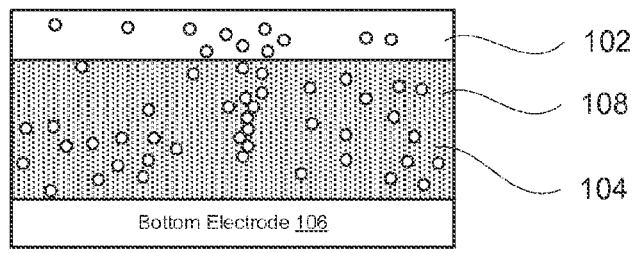

FIGS. 1A-1C illustrate a schematic representation of a ReRAM operation according to some embodiments. A basic building unit of a memory device is a stack having a capacitor like structure. A ReRAM cell includes two electrodes and a dielectric positioned in between these two electrodes. FIG. 1A illustrates a schematic representation of ReRAM cell 100 including top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, and other components. ReRAM cell 100 is sometimes referred to as a memory element or a memory unit.

Top electrode 102 and bottom electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface). The other interface of the resistive switching layer may be inert and may be formed with an inert electrode or a diffusion barrier layer.

Resistance switching layer 104 which may be initially formed from a dielectric material and later can be made to conduct through one or more conductive paths formed within the layer by applying first a forming voltage and then a switching voltage. To provide this resistive switching functionality, resistance switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

In some embodiments, these defects may be utilized for ReRAM cells operating according to a valence change mechanism, which may occur in specific transition metal oxides, nitrides, and oxy-nitrides. For example, defects may be oxygen vacancies triggered by migration of oxygen anions. Migrations of oxygen anions correspond to the motion of corresponding oxygen vacancies that are used to create and break conductive paths. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature. Some of these mechanisms will be further described below with reference to FIGS. 1A-1C. In the described examples, top electrode 102 is reactive, while bottom electrode 106 is inert or is separated from resistive switching layer 104 by a diffusion barrier layer (not shown). One having ordinary skills in the art would understand that other arrangements are possible as well and within the scope of this disclosure.

Specifically, FIG. 1A is a schematic representation of ReRAM cell 100 prior to initial formation of conductive paths, in accordance with some embodiments. Resistive switching layer 104 may include some defects 108. Additional defects 108 may be provided within top electrode 102 and may be later transferred to resistive switching layer 104 during the formation operation. In some embodiments, the resistive switching layer 104 has substantially no defects prior to the forming operation and all defects are provided from top electrode 102 during forming. Bottom electrode 106 may or may not have any defects. It should be noted that regardless of the presence or absence of defects in bottom electrode 106, substantially no defects are exchanged between bottom electrode 106 and resistive switching layer 104 during forming and/or switching operations.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistance switching layer 104 to form these conductive paths 110 as, for example, schematically shown in FIG. 1B. Furthermore, some or all defects 108 forming the conductive paths may enter resistive switching layer 104 from top electrode 102. For simplicity, all these phenomena are collectively referred to as reorientation of defects within ReRAM cell 100. This reorientation of defects 108 occurs when a certain forming voltage 104 is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or re-formed. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into top electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and top electrode 102, the conductive paths may break closer to the interface with bottom electrode 106, somewhere within resistive switching layer 104, or at the interface with top electrode 102. This breakage generally does not correspond to complete dispersion of defects forming these conductive paths and may be a self limiting process, i.e., the process may stop after some initial breakage occurs.

When switching from its HRS to LRS, which is often referred to as a set operation, resistive switching layer 104 may receive some defects from top electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 104 during the set operation has the same polarity as a voltage applied during the reset operation. This type of switching is referred to as unipolar switching. Some examples of cells that exhibit unipolar switching behavior include resistive switching layers formed from most metal oxide and having inert electrodes at both sides, e.g., Pt/MeO$_x$/Pt. Alternatively, a voltage applied to electrodes 102 and 104 during the set operation may have different polarity as a voltage applied during the reset operation. This type of switching is referred to as bipolar switching. Some examples of cells that exhibit bipolar switching behavior include resistive switching layers formed from MeOx having one inert electrode and one reactive electrode, e.g., TiN/MeOx/Pt and TiN/MeOx/poly-Si. Setting and resetting operations may be repeated multiple times as will now be described with reference to FIGS. 2A and 2B.

Figure 2A:
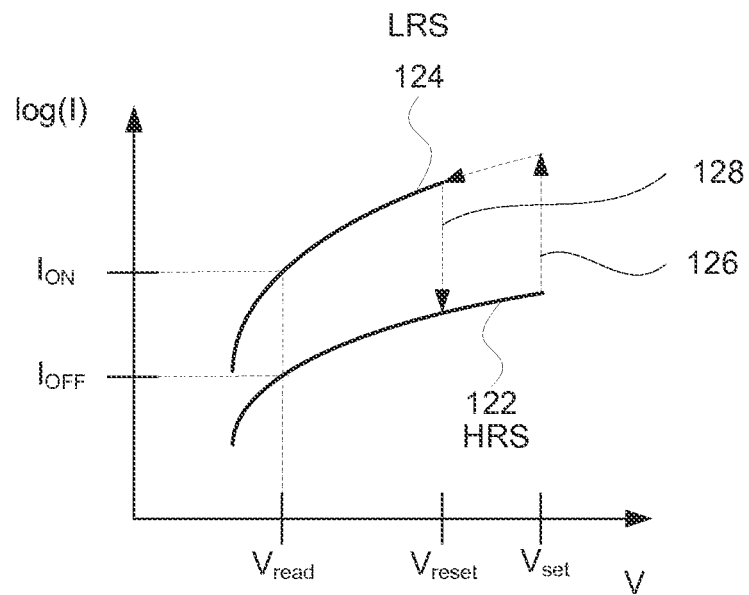
FIG. 2A illustrates a plot of a current passing through a unipolar ReRAM cell as a function of a voltage applied to the ReRAM cell, in accordance with some embodiments.
Figure 2B:
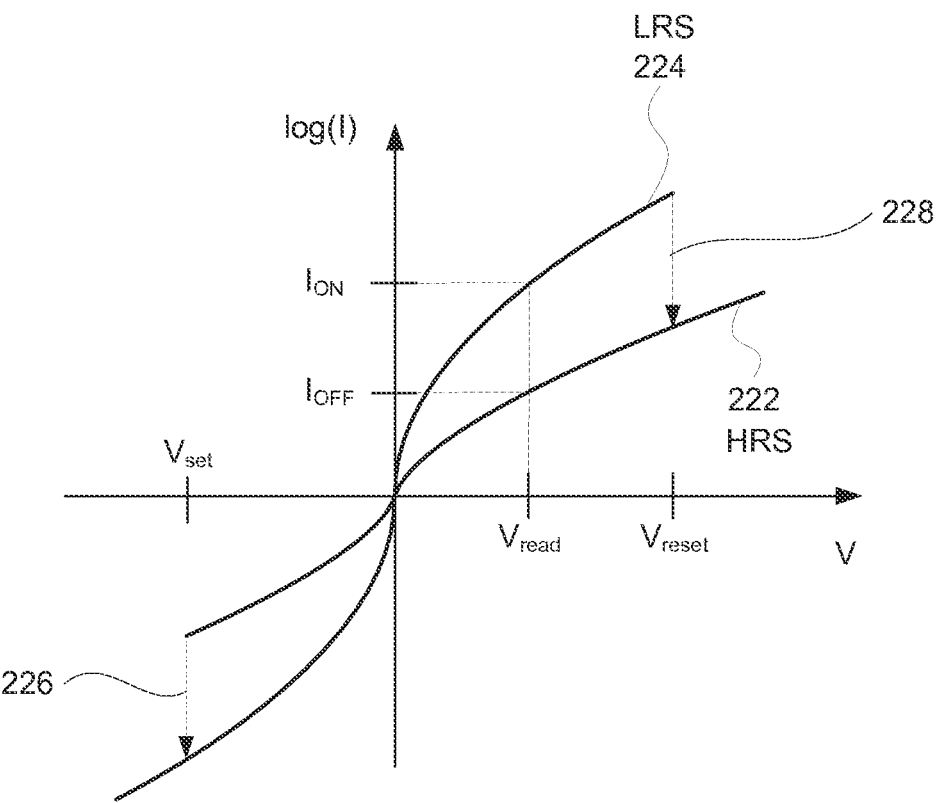
FIG. 2B illustrates the same type of a plot for a bipolar ReRAM cell, in accordance with some embodiments.

FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in FIG. 2A and by lines 222 and 224 respectively in FIG. 2B. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistance switching layer can be sensed by applying a sensing voltage to its electrodes. The sensing voltage is sometimes referred to as a "READ" voltage or simply a reading voltage and indicated as $V_{READ}$ in FIGS. 2A and 2B. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistance switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistance switching layer. Switching from a LRS to HRS is indicated by dashed line 128 in FIG. 2A and line 228. Detecting the state of the ReRAM cell while it is in its HRS is described above.

It should be noted that polarity of the reset voltage and the set voltage may be the same as shown in FIG. 2A or different as shown in FIG. 2B. The cells that have the same polarity of set and reset voltages are referred to as unipolar cells, while the cells that have different polarities of h set and reset voltages are referred to as bipolar cells. Without being restricted to any particular theory, it is believed that unipolar switching occurs due to metallic filament formation and destruction caused by resistive heating and application of electrical field. Bipolar switching is believed to be based on filaments formed from oxygen vacancies. The formation and rupture of filament is done by oxygen vacancy moving back and forth. The switching voltages of unipolar and bipolar switching are typically comparable. However, the endurance of bipolar is generally better than that of unipolar.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

In some embodiments, the same ReRAM cell may include two or more resistance switching layers interconnected in series. Adjacent resistance switching layers may directly interface each other or be separated by an intermediate layer.

The ReRAM cells can be configured in a cross point memory array. The cross point memory arrays can include horizontal word lines that cross vertical bit lines. Memory cells can be located at the cross points of the word lines and the bit lines. The memory cells can function as the storage elements of a memory array.

Figure 3:
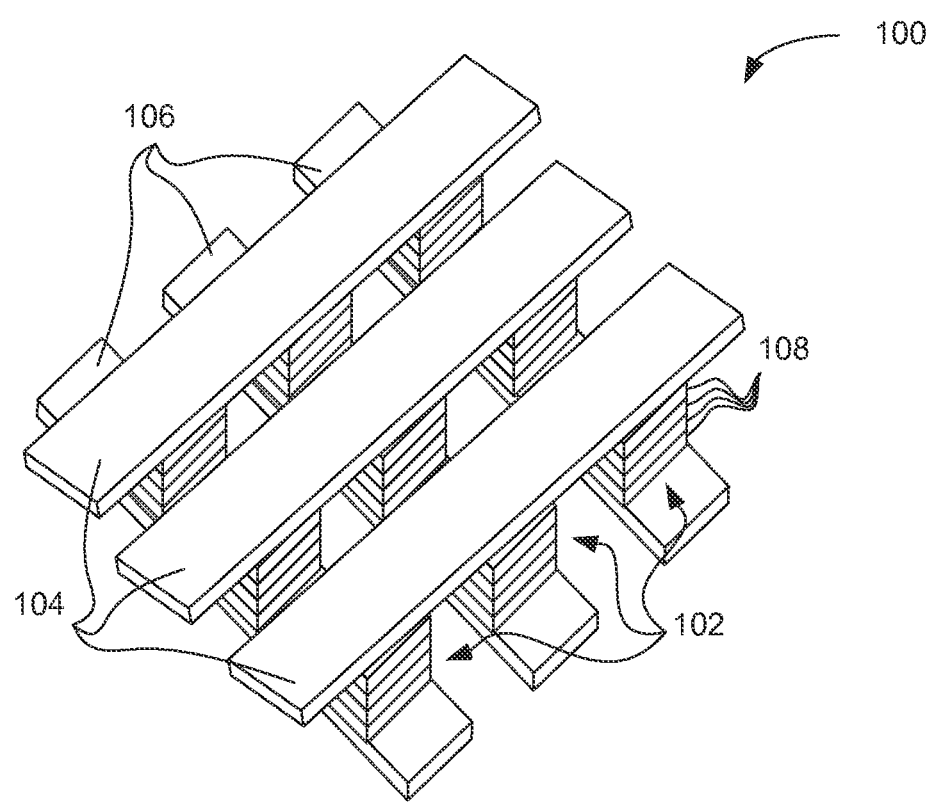
FIG. 3 illustrates a memory array of resistive switching memory elements according to some embodiments.

FIG. 3 illustrates a memory array of resistive switching memory elements according to some embodiments. Memory array 300 may be part of a memory device or other integrated circuit. Memory array 300 is an example of potential memory configurations; it is understood that several other configurations are possible.

Read and write circuitry may be connected to memory elements 302 using signal lines 304 and orthogonal signal lines 306. Signal lines such as signal lines 304 and signal lines 306 are sometimes referred to as word lines and bit lines and are used to read and write data into the elements 302 of array 300. Individual memory elements 302 or groups of memory elements 302 can be addressed using appropriate sets of signal lines 304 and 306. Memory element 302 may be formed from one or more layers 308 of materials, as is described in further detail below. In addition, the memory arrays shown can be stacked in a vertical fashion to make multi-layer 3-D memory arrays.

Any suitable read and write circuitry and array layout scheme may be used to construct a non-volatile memory device from resistive switching memory elements such as element 302. For example, horizontal and vertical lines 304 and 306 may be connected directly to the terminals of resistive switching memory elements 302. This is merely illustrative.

During the operation of the cross point memory array, such as a read operation, the state of a memory element 302 can be sensed by applying a sensing voltage (i.e., a "read" voltage) to an appropriate set of signal lines 304 and 306. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, the state of a memory element can be changed by application of suitable write signals to an appropriate set of signal lines 304 and 306.

In some embodiments, methods and systems for lower applied voltages, such as forming voltage, to a memory element, for example, during a forming operation, are provided. A built-in electric field can be formed in the dielectric layer of the memory element to assist with the forming operation. The built-in field can be generated by local dipole layers. For example, an oppositely charged layer, e.g., a positive layer disposed in the vicinity of a negative layer, can form a dipole layer in the dielectric layer. The built-in field can be generated by an induced field applied to the whole dielectric layer. For example, a work function difference due to the electrodes having different work function values can induce an electric field within the dielectric layer. In the present description, the expression "in a vicinity" can mean "nearby" or "closer than anything else". For example, the positive layer can be disposed closer to the negative layer as compared to any other charged layer, or to an electrode. Alternatively, "in a vicinity" can be used to mean a distance of less than 3 nm, for example, between 0.3 to 3 nm.

Figure 4:
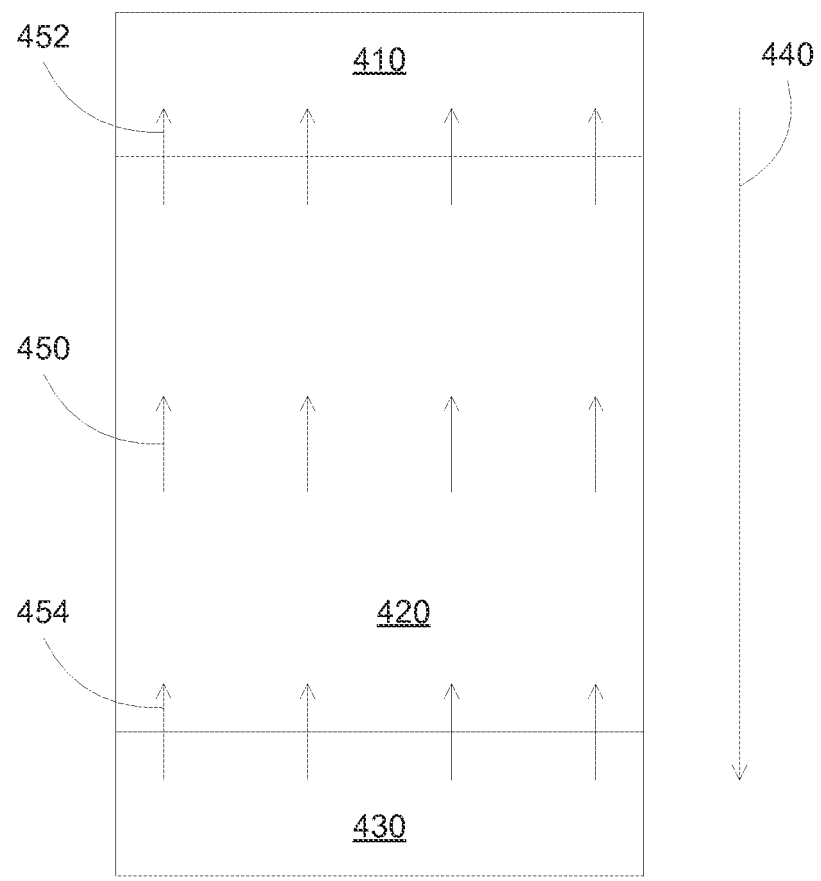
FIG. 4 illustrates a memory device with build-in electric fields according to some embodiments.

FIG. 4 illustrates a memory device with build-in electric fields according to some embodiments. A dielectric layer 420, such as a switching dielectric layer or a memory element, can be sandwiched between two electrodes 410 and 430. If there is a work function difference between the two electrodes 410 and 430, an electric field 440 can be induced within the dielectric layer 420, from one electrode to another electrode. Alternatively, a local dipole layer 450 can be formed in the dielectric layer 420, generating an electric field opposite to the dipole 450 and spanning through the entire stack. A charge layer can be formed in the dielectric layer, at or near the interface between the dielectric layer and the electrode, which can induce an opposite charge layer in the electrode. The two oppositely charge layers, one in the dielectric layer and the other is induced in the electrode, can form dipole layers 452 or 45, which can generate electric fields opposite to the dipoles and spanning through the entire stack.

FIGS. 5A-5D illustrate memory devices with dipole layers according to some embodiments. A dielectric layer 520, such as a switching dielectric layer or a memory element, can be sandwiched between two electrodes 510 and 530. In FIG. 5A, a positively charged layer 521 can be placed immediately next to a negatively charged layer 526 within the dielectric layer 520. The two oppositely charged layers can form a dipole layer, which can generate an electric field within the dielectric layer 520 (and outside the dipole layer of 521/526). In FIG. 5B, a positively charged layer 522 can be place near a negatively charged layer 527 within the dielectric layer 520. The two oppositely charged layers can form a dipole layer, which can generate an electric field in the dielectric layer 520 (and outside the dipole layer of 522/527). The separation of the two charged layers 522 and 527 can be smaller than the distance to the nearest electrode, for example, to prevent reacting with the electrode, e.g., inducing a charge layer in the electrode. The separation can be less than about 3 nm, such as between 0.3 and 3 nm. The charged layers can be formed by replacement elements in the dielectric layer with higher or lower valence elements. The charged layers can be formed by alloying a portion of the layer, e.g., greater than about 10 at % or greater than about 30 at %, with elements having higher or lower valence. The charged layers can be repeated, e.g., many dipole layers can be formed within the dielectric layer. In some embodiments, the portion of the dipole layers or the charged layers can be less than about 30% of the total dielectric thickness, e.g. less than 10% of the total dielectric thickness.

In FIG. 5C, a negatively charged layer 528 can be placed within the dielectric layer 520 and close, e.g., immediately adjacent or having a small separation distance, to the interface with an electrode, e.g., electrode 510. The negatively charged layer 528 can induce a positively charged layer 518 in the electrode 510. The induced charged layer 518 and the charged layer 528 can form a dipole layer, which can generate an electric field in the dielectric layer 520. In FIG. 5DC, a positively charged layer 523 can be placed within the dielectric layer 520 and close, e.g., immediately adjacent or having a small separation distance, to the interface with an electrode, e.g., electrode 530. The positively charged layer 523 can induce a negatively charged layer 533 in the electrode 530. The induced charged layer 533 and the charged layer 523 can form a dipole layer, which can generate an electric field in the dielectric layer 520. The interface charge layers can be between 5% and 50% of the total thickness of the dielectric layer. The portion of doping, e.g., element replacement or alloying, can be between 0.05 at % to 10 at %.

In some embodiments, the charged layer can be formed by doping, e.g., by substitutional doping or by alloying. For example, by replacing a metal element in the dielectric layer with another metal element with lower valance, a negative charge can be generated due to the excess electrons of the oxygen elements. Alternatively, by replacing oxygen elements in the dielectric layer with elements having lower valance, a negative charge can be generated due to the excess electrons of the metal elements. Or by replacing oxygen elements in the dielectric layer with elements having higher valance, a positive charge can be generated due to the lack of electrons of the oxygen elements.

Figure 6A:
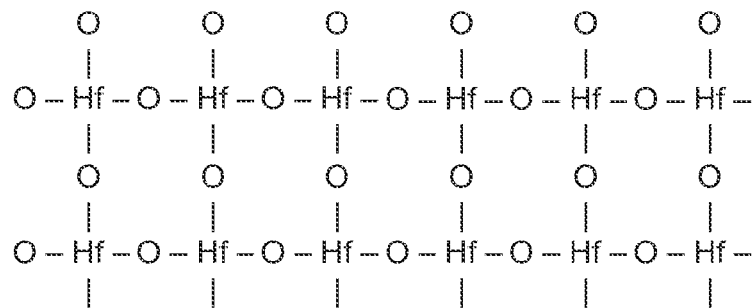
FIGS. 6A-6C illustrate a substitution doping process to generate a negative charge layer according to some embodiments.
Figure 6B:
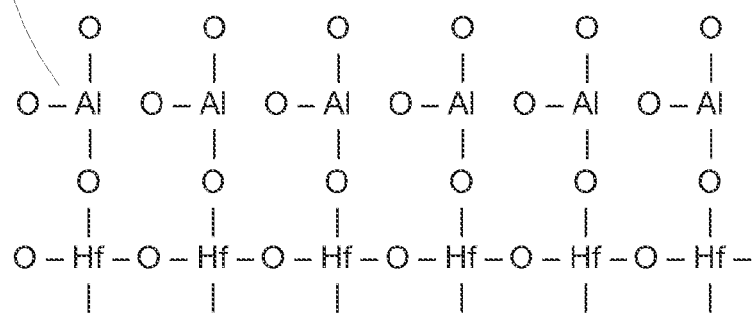
Figure 6C:

FIGS. 6A-6C illustrate a substitution doping process to generate a negative charged layer according to some embodiments. FIG. 6A shows a dielectric layer 620 of $HfO_2$. A schematic bonding structure of $HfO_2$ is shown in the dielectric layer 620, in which hafnium metal elements are bonded to oxygen elements. The figure is served as an illustration to show a possible element configuration, and is not necessarily the arrangement of $HfO_2$ in the whole dielectric layer. For example, the $HfO_2$ dielectric layer 520 can be an amorphous layer, or can be a nanocrystalline or microcrystalline layer.

In FIG. 6B, some Hf elements can be replaced by Al elements 622. The replacement can be formed by a deposition process, or be a treatment process. For example, in an ALD process, one or more cycles of a Hf precursor can be replaced with an Al precursor. Substitute replacement can be used, but other replacement configuration can be used, such as Al alloying with Hf to introduce Al to the $HfO_2$ dielectric layer. Since Al has lower valence than Hf, it can act as a acceptor-like dopant, inducing impurity states in the range of energies relatively close to the valence band maximum of $HfO_2$. These states can trap excess electrons, e.g., from an electron reservoir such as a nearby electrode or compensating donor-like defects, forming a charge layer 624 (FIG. 6C). In some embodiments, the doping elements can be more than about 10 at %.

Figure 7A:
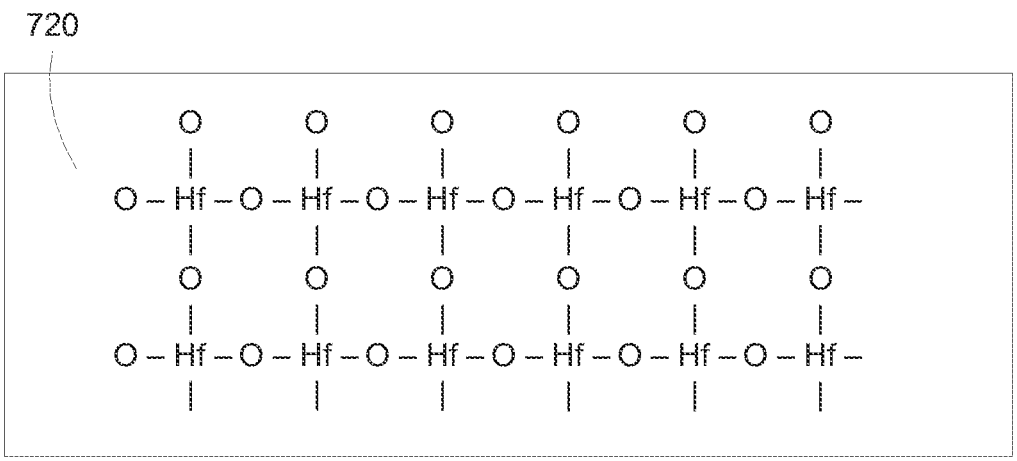
FIGS. 7A-7C illustrate a substitution doping process to generate a negative charge layer according to some embodiments.
Figure 7B:
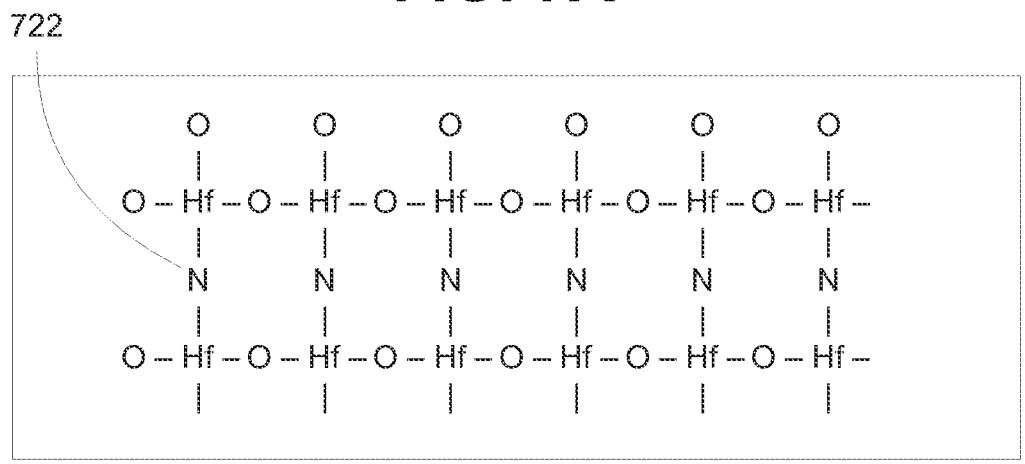
Figure 7C:
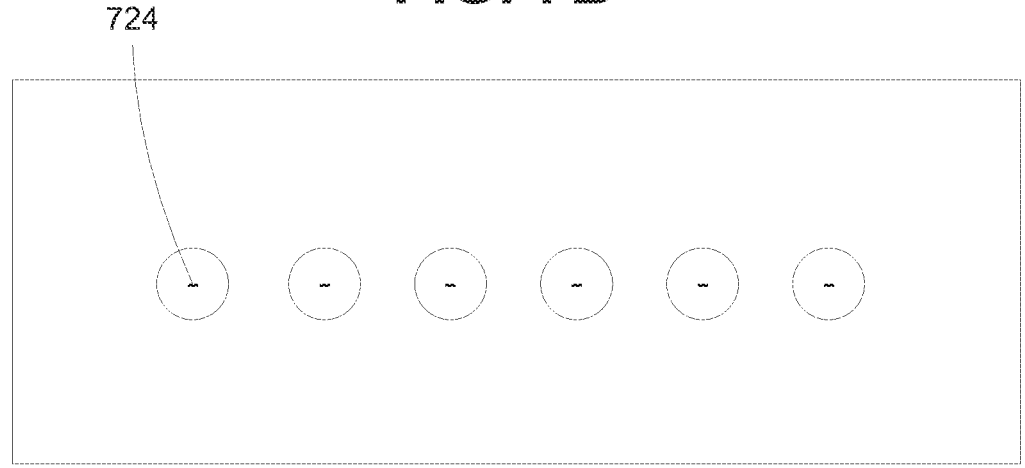

FIGS. 7A-7C illustrate a substitution doping process to generate a negative charge layer according to some embodiments. FIG. 7A shows a dielectric layer 720 of $HfO_2$. In FIG. 7B, some oxygen elements can be replaced by nitrogen elements 722. The replacement can be formed by a deposition process, or be a treatment process. For example, in an ALD process, one or more cycles of an oxygen precursor can be replaced with a nitrogen precursor. Since nitrogen has lower valence than oxygen, it can act as a acceptor-like dopant, inducing impurity states in the range of energies relatively close to the valence band maximum of $HfO_2$. These states can trap excess electrons, e.g., from an electron reservoir such as a nearby electrode or compensating donor-like defects, forming a charge layer 724 (FIG. 7C). In some embodiments, the doping elements can be more than about 30%.

Figure 8A:
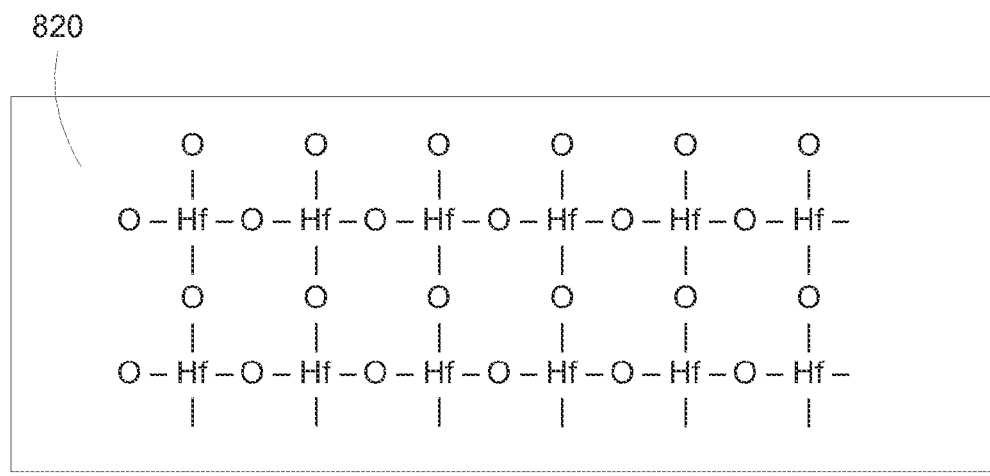
FIGS. 8A-8C illustrate a substitution doping process to generate a negative charge layer according to some embodiments.
Figure 8B:
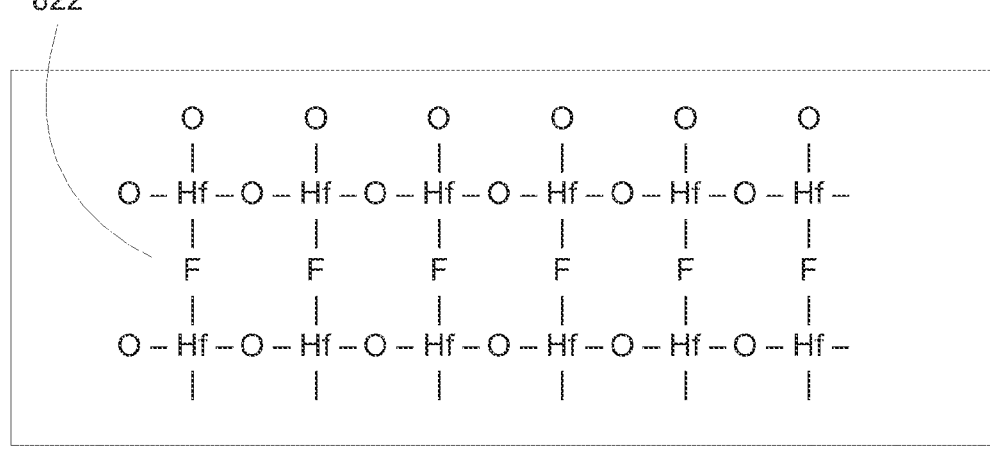
Figure 8C:

FIGS. 8A-8C illustrate a substitution doping process to generate a positive charge layer according to some embodiments. FIG. 8A shows a dielectric layer 820 of $HfO_2$. In FIG. 8B, some oxygen elements can be replaced by fluorine elements 822. The replacement can be formed by a deposition process, or be a treatment process. For example, in an ALD process, one or more cycles of an oxygen precursor can be replaced with a fluorine precursor. Since fluorine has higher valence than oxygen, it can act as a donor-like dopant, donating electrons in induced impurity states in the range of energies relatively close to the conduction band minimum of $HfO_2$. These states can donate electrons into an electron reservoir such as a nearby electrode or compensating acceptor-like defects, forming a charge layer 824 (FIG. 8C). In some embodiments, the doping elements can be more than about 30%.

In some embodiments, memory devices, and methods to fabricate memory devices, for resistive-switching memory elements and cross point memory array are provided. The memory device can be constructed using familiar and available materials currently used in fabrication facilities. The fabrication process of the memory device can require low thermal budget, suitable for back end or 3D memory applications. In addition, the process can be simple, providing a robust process for manufacturing.

In some embodiments, the memory devices can include two electrode layers having different work functions. The work function difference can be greater than about 0.5 eV, or can be greater than about 1 eV. For example, the electrodes can include materials having high work function, such as Pt, Au, Ag, W, $MoO_2$, $MoSi_xO_y$, or their alloys. The electrodes can include materials having medium work function, such as TiN, Al, or their alloys. The electrodes can include materials having low work function, such as Mg, Hf, Zr, Eu, La, or their alloys. The work function difference can assist in lowering the applied voltage, for example, during a forming process of the memory element.

Figure 9A:
FIGS. 9A-9D illustrate an example of an energy band diagram for a memory device according to some embodiments.
Figure 9B:
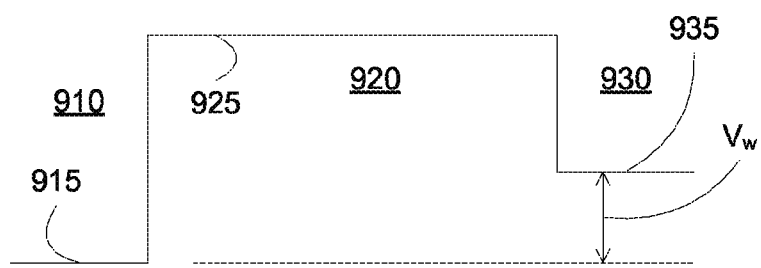
Figure 9C:
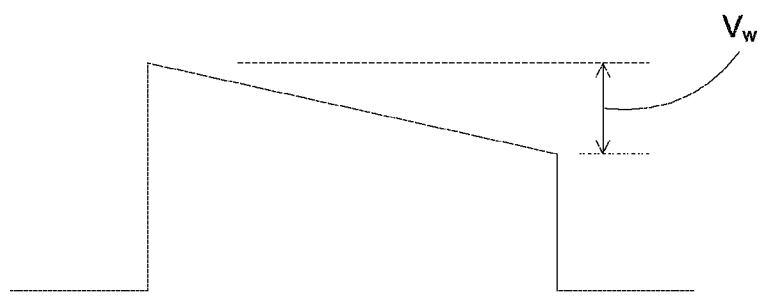
Figure 9D:
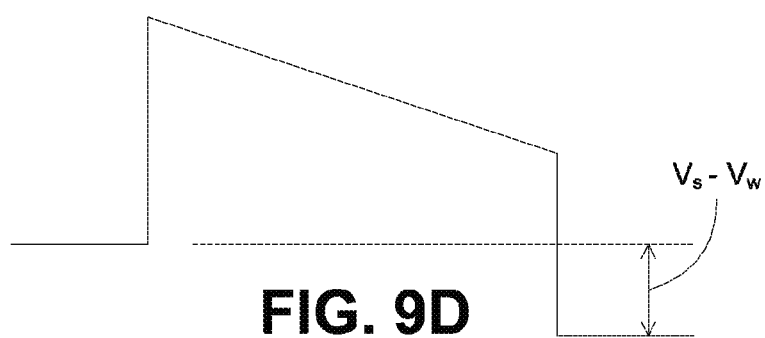

FIGS. 9A-9D illustrate an example of an energy band diagram for a memory device according to some embodiments. FIG. 9A shows a dielectric layer 920, such as a switching dielectric layer or a memory element, sandwiched between two electrodes 910 and 930. FIG. 9B shows an energy band diagram of the memory device, including the Fermi levels 915 and 935 of the two electrodes 910 and 930, respectively. Also shown is the top portion of the band gap 925 of the dielectric layer 920. The two electrodes 910 and 930 can have different work function, for example, having a work function difference of $V_w$. FIG. 9C shows the band diagram in equilibrium, with equal value for the Fermi levels of the two electrodes. The band gap of the dielectric layer can exhibit a slope, e.g., band bending, due to the equilibrium configuration of the Fermi levels. The band bending can form an induced field, e.g., proportional to the work function difference $V_w$, between the two electrodes. In FIG. 9D, a voltage can be applied to an electrode, e.g., electrode 930, further lowering the Fermi level of the electrode 930. The applied voltage can be $V_a$, but the effect on the dielectric layer can be $V_s = V_a + V_w$. In other words, the applied voltage can be reduced by a value equal to $V_w$, but the effect remains the same on the dielectric layer.

In some embodiments, the memory devices can include one or more dipole layers within the dielectric layer. The dipole layers can occupy less than 30% of the total dielectric layer, for example, to reduce potential interference with the dielectric functionality. The dipole layers can assist in lowering the applied voltage, for example, during a forming process of the memory element.

Figure 10A:
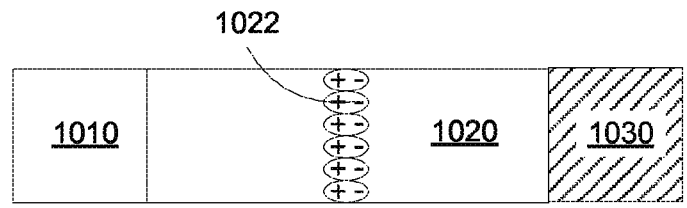
FIGS. 10A-10D illustrate an example of an energy band diagram for a memory device according to some embodiments.
Figure 10B:
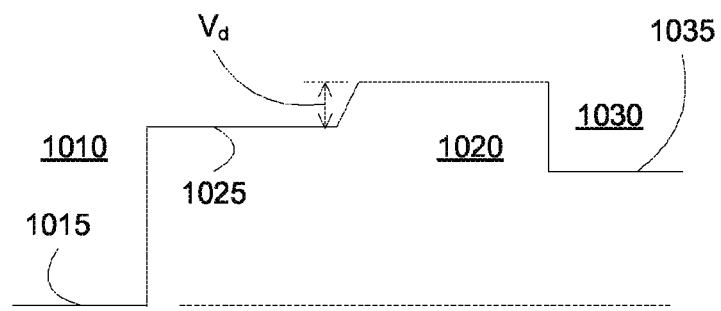
Figure 10C:
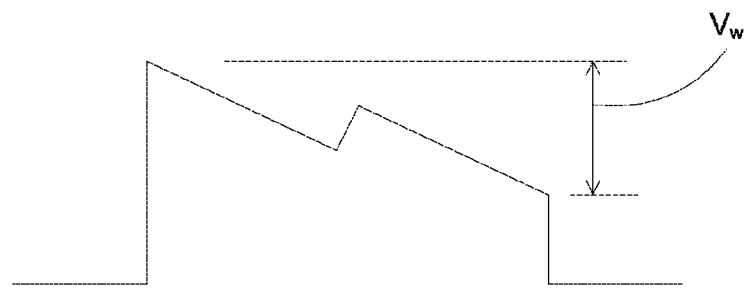
Figure 10D:
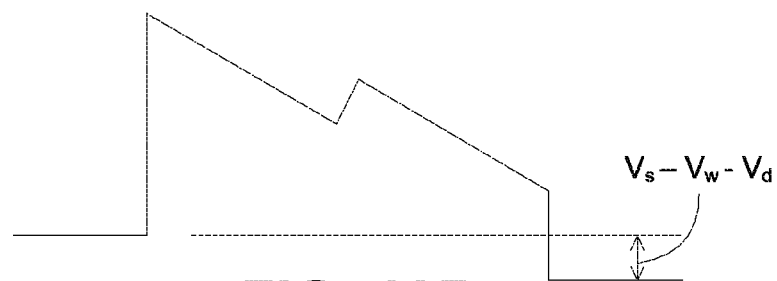

FIGS. 10A-10D illustrate an example of an energy band diagram for a memory device according to some embodiments. FIG. 10A shows a dielectric layer 1020, such as a switching dielectric layer or a memory element, sandwiched between two electrodes 1010 and 1030. A dipole layer 1022 can be formed within the dielectric layer 1020. The dipole layer 1022 can include a positively charged layer and a negatively charged layer, separated by a distance. FIG. 10B shows an energy band diagram of the memory device, including the Fermi levels 1015 and 1035 of the two electrodes 1010 and 1030, respectively. Also shown is the top portion of the band gap 1025 of the dielectric layer 1020. The band gap 1025 can exhibit a slope $V_d$, representing the dipole layer 1022. The two electrodes 1010 and 1030 can have different work functions. FIG. 10C shows the band diagram in equilibrium, with equal value for the Fermi levels of the two electrodes. The band gap of the dielectric layer can exhibit a slope, e.g., band bending, due to the equilibrium configuration of the Fermi levels. The band bending can form an induced field, e.g., proportional to the work function difference $V_w$, between the two electrodes. In addition, a slope can be formed within the dielectric band energy, at the location of the dipole layer, which is proportional to the dipole voltage $V_d$. In FIG. 10D, a voltage can be applied to an electrode, e.g., electrode 1030, further lowering the Fermi level of the electrode 1030. The applied voltage can be $V_s - V_w - V_d$, but the effect on the dielectric layer can be $V_s$. In other words, the applied voltage can be dropped by a value equal to the sum of $V_w$ and $V_s$, but the effect remains the same on the dielectric layer.

Figure 11A:
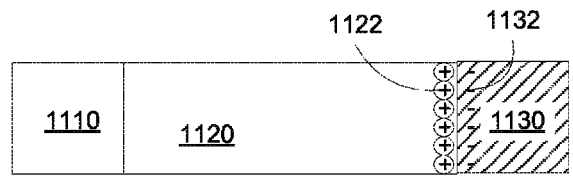
FIGS. 11A-11D illustrate an example of an energy band diagram for a memory device according to some embodiments.
Figure 11B:
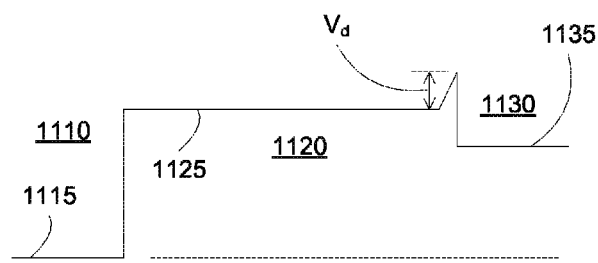
Figure 11C:
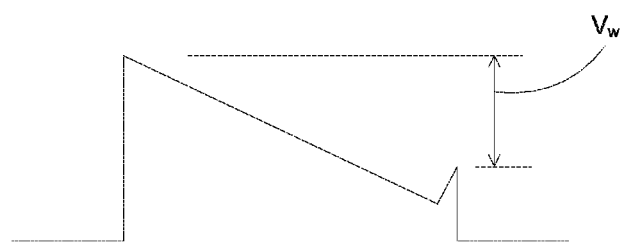
Figure 11D:
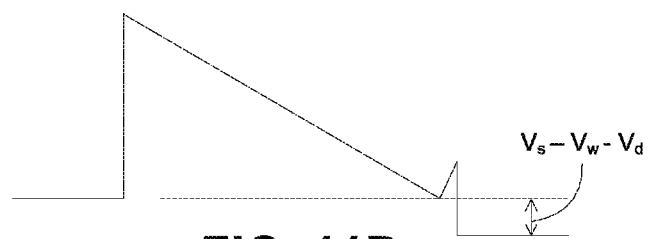

FIGS. 11A-11D illustrate an example of an energy band diagram for a memory device according to some embodiments. FIG. 11A shows a dielectric layer 1120, such as a switching dielectric layer or a memory element, sandwiched between two electrodes 1110 and 1130. A positively charged layer 1122 can be formed within the dielectric layer 1120, at or near the interface with the electrode 1130. The positively charged layer 1122 can induce a negatively charged layer 1132 in the electrode 1130, forming a dipole layer. FIG. 11B shows an energy band diagram of the memory device, including the Fermi levels 1115 and 1135 of the two electrodes 1110 and 1130, respectively. Also shown is the top portion of the band gap 1125 of the dielectric layer 1120. The band gap 1125 can exhibit a slope $V_d$, representing the dipole layer, which includes the charged layer 1122 and the induced charged layer 1132. The two electrodes 1110 and 1130 can have different work functions. FIG. 11C shows the band diagram in equilibrium, with equal value for the Fermi levels of the two electrodes. The band gap of the dielectric layer can exhibit a slope, e.g., band bending, due to the equilibrium configuration of the Fermi levels. The band bending can form an induced field, e.g., proportional to the work function difference $V_w$, between the two electrodes. In addition, a slope can be formed within the dielectric band energy, at the location of the dipole layer, which is proportional to the dipole voltage $V_d$. In FIG. 11D, a voltage can be applied to an electrode, e.g., electrode 1130, further lowering the Fermi level of the electrode 1130. The applied voltage can be $V_s - V_w - V_d$, but the effect on the dielectric layer can be $V_s$. In other words, the applied voltage can be dropped by a value equal to the sum of $V_w$ and $V_s$, but the effect remains the same on the dielectric layer.

Figure 12A:
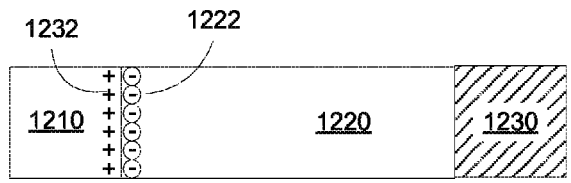
FIGS. 12A-12D illustrate an example of an energy band diagram for a memory device according to some embodiments.
Figure 12B:
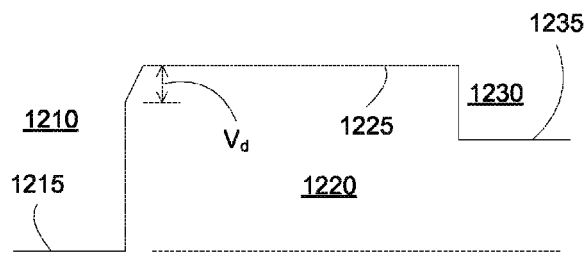
Figure 12C:
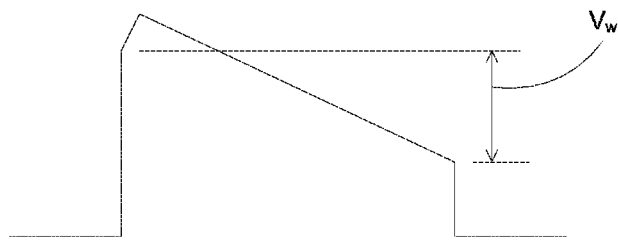
Figure 12D:
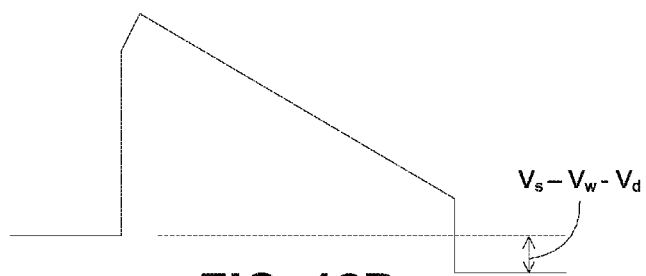

FIGS. 12A-12D illustrate an example of an energy band diagram for a memory device according to some embodiments. FIG. 12A shows a dielectric layer 1220, such as a switching dielectric layer or a memory element, sandwiched between two electrodes 1210 and 1230. A negatively charged layer 1222 can be formed within the dielectric layer 1220, at or near the interface with the electrode 1210. The negatively charged layer 1222 can induce a positively charged layer 1232 in the electrode 1210, forming a dipole layer. FIG. 12B shows an energy band diagram of the memory device, including the Fermi levels 1215 and 1235 of the two electrodes 1210 and 1230, respectively. Also shown is the top portion of the band gap 1225 of the dielectric layer 1220. The band gap 1225 can exhibit a slope $V_d$, representing the dipole layer, which includes the charge layer 1222 and the induce charge layer 1232. The two electrodes 1210 and 1230 can have different work functions. FIG. 12C shows the band diagram in equilibrium, with equal value for the Fermi levels of the two electrodes. The band gap of the dielectric layer can exhibit a slope, e.g., band bending, due to the equilibrium configuration of the Fermi levels. The band bending can form an induced voltage, e.g., proportional to the work function difference $V_w$, between the two electrodes. In addition, a slope can be formed within the dielectric band energy, at the location of the dipole layer, which is proportional to the dipole voltage $V_d$. In FIG. 12D, a voltage can be applied to an electrode, e.g., electrode 1230, further lowering the Fermi level of the electrode 1230. The applied voltage can be $V_s - V_w - V_d$, but the effect on the dielectric layer can be $V_s$. In other words, the applied voltage can be dropped by a value proportional to $V_w$ and $V_s$, but the effect remains the same on the dielectric layer.

In some embodiments, the memory device including a memory element can be used in a memory array, such as a cross point array. For example, the memory element can form a columnar memory device, which can be placed at the cross points of the word lines and bit lines.

Figure 13:
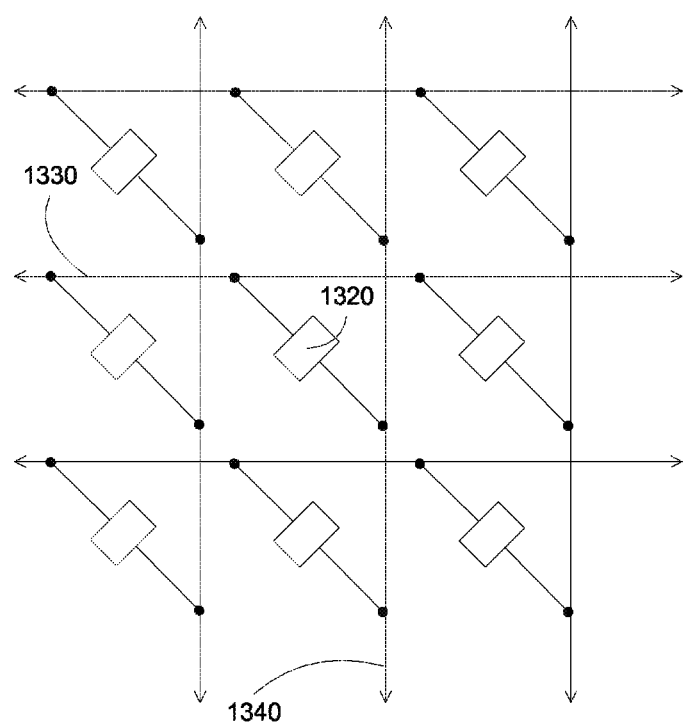
FIG. 13 illustrates a cross point memory array according to some embodiments.

FIG. 13 illustrates a cross point memory array according to some embodiments. A switching memory device can include a memory element 1320, which is both disposed between the electrodes 1330 and 1340. The memory element 1320 can include two or more dipole layers, and different work function electrodes that are configured to provide a built in electric field as discussed above.

In some embodiments, the memory device including a memory element and a current selector can be used in a memory array, such as a cross point array. For example, the current selector can be fabricated on the memory element, forming a columnar memory device, which can be placed at the cross points of the word lines and bit lines.

Figure 14:
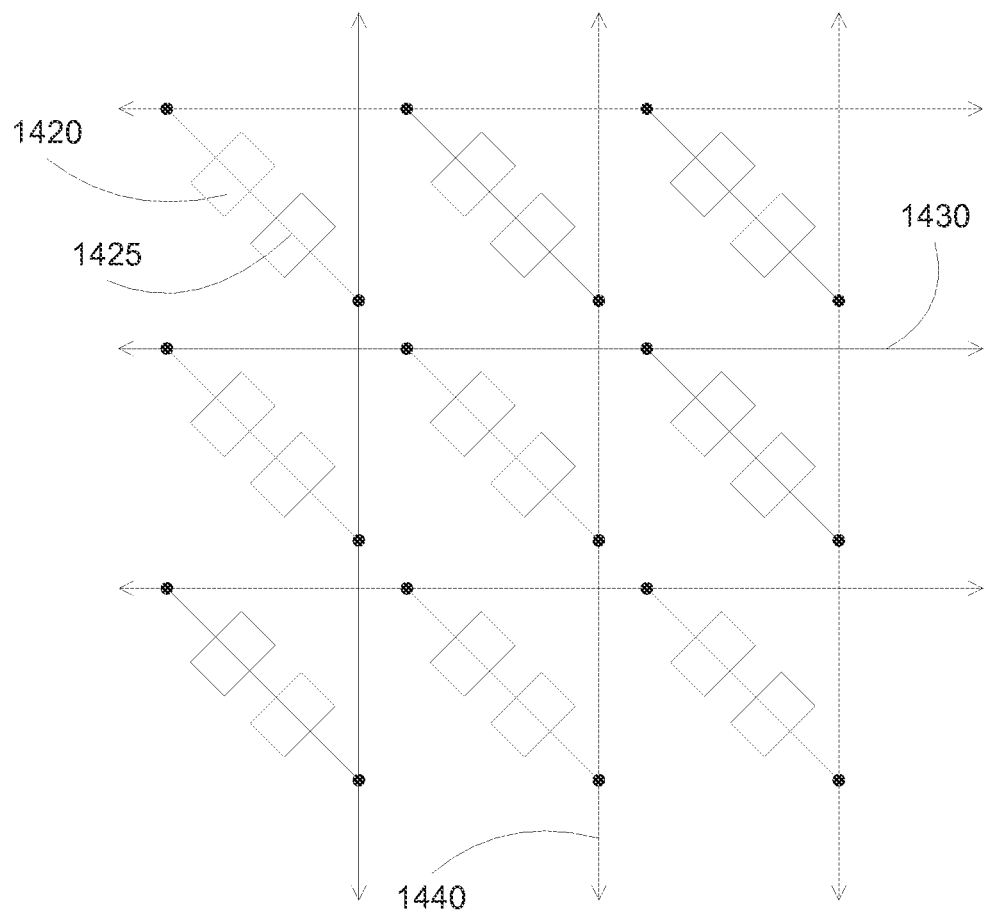
FIG. 14 illustrates a cross point memory array according to some embodiments.

FIG. 14 illustrates a cross point memory array according to some embodiments. A switching memory device can include a memory element 1420 and a current selector 1425, which are both disposed between the electrodes 1430 and 1440. The current selector can include a diode, which can function to reduce or eliminate leakage currents in the memory array. The current selector 1425 can be an intervening electrical component, disposed between electrode 1430 and memory element 1420, or between the electrode 1440 and memory element 1420. The memory element 1320 can include two or more dipole layers, and different work function electrodes that are configured to provide a built in electric field.

Figure 15:
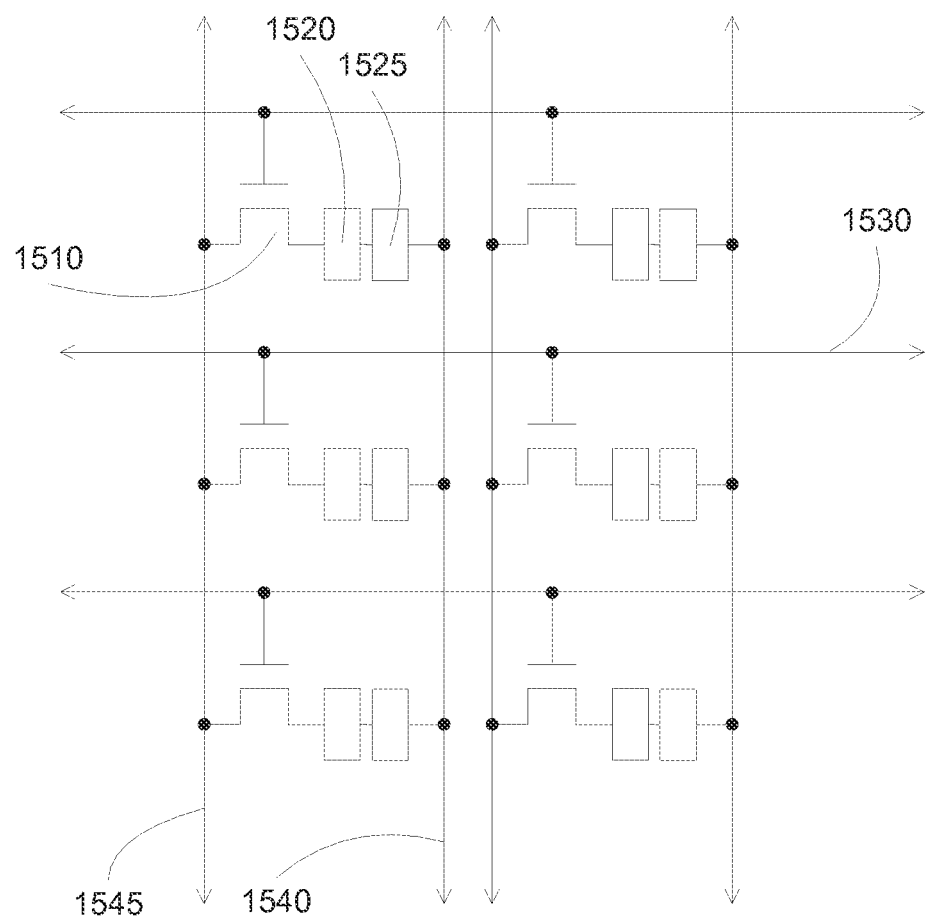
FIG. 15 illustrates a cross point memory array according to some embodiments.

FIG. 15 illustrates a cross point memory array according to some embodiments. A switching memory device can include a memory element 1520 and a current selector 1525, which are both disposed between the electrodes 1540 and 1545. Another selector device, such as a transistor 1510, can be used to isolate the memory devices, for example, through the control lines 1530.

Figure 16:
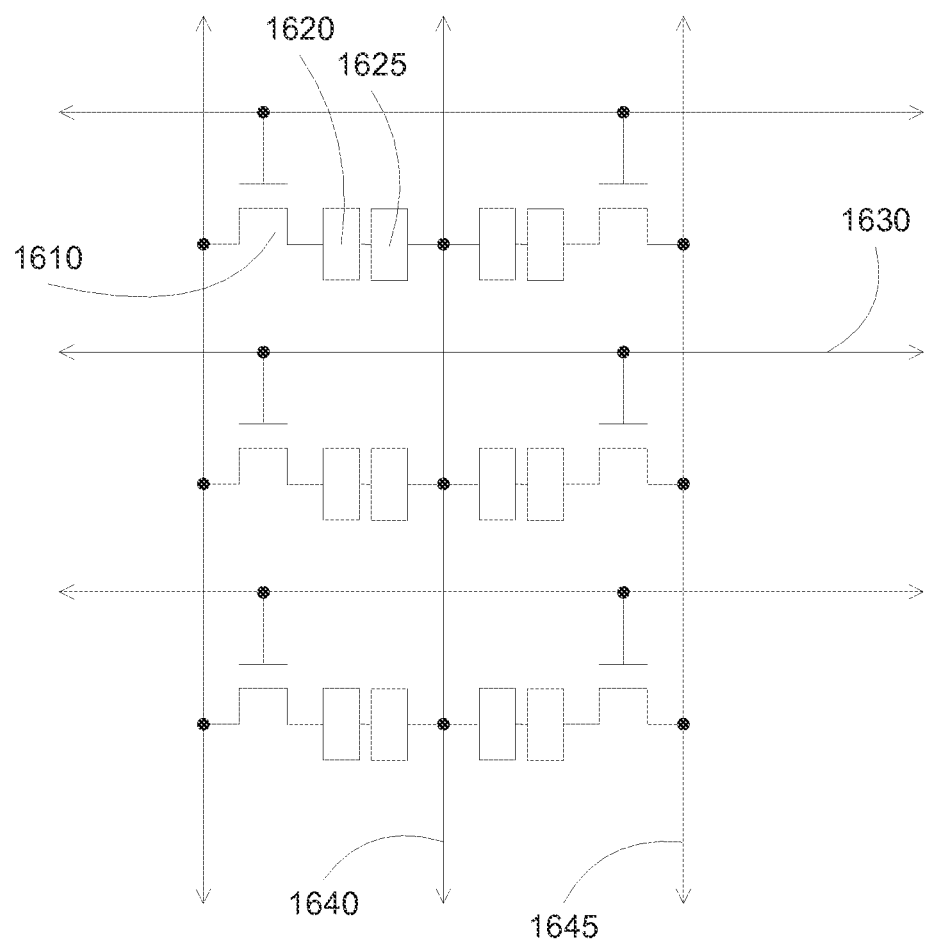
FIG. 16 illustrates another cross point memory array according to some embodiments.

FIG. 16 illustrates another cross point memory array according to some embodiments. The memory devices can be connected back to back, sharing electrodes 1640 and 1645. Control lines 1630 can be used to turn on transistor 1610, to select memory element 1620 and current selector 1625.

In some embodiments, methods to form memory devices can be provided. The methods can include depositing a first electrode, a second electrode, a dielectric layer between the two electrodes, and charge layers within the dielectric layer, together with optionally performing treatments after each layer. The electrodes can include materials having different work functions. The treatment can include rapid thermal annealing or plasma treatment, such as a rapid thermal anneal in temperatures between 200 and 400 C., plasma oxygen anneal, and/or in-situ annealing after deposition.

Figure 17:
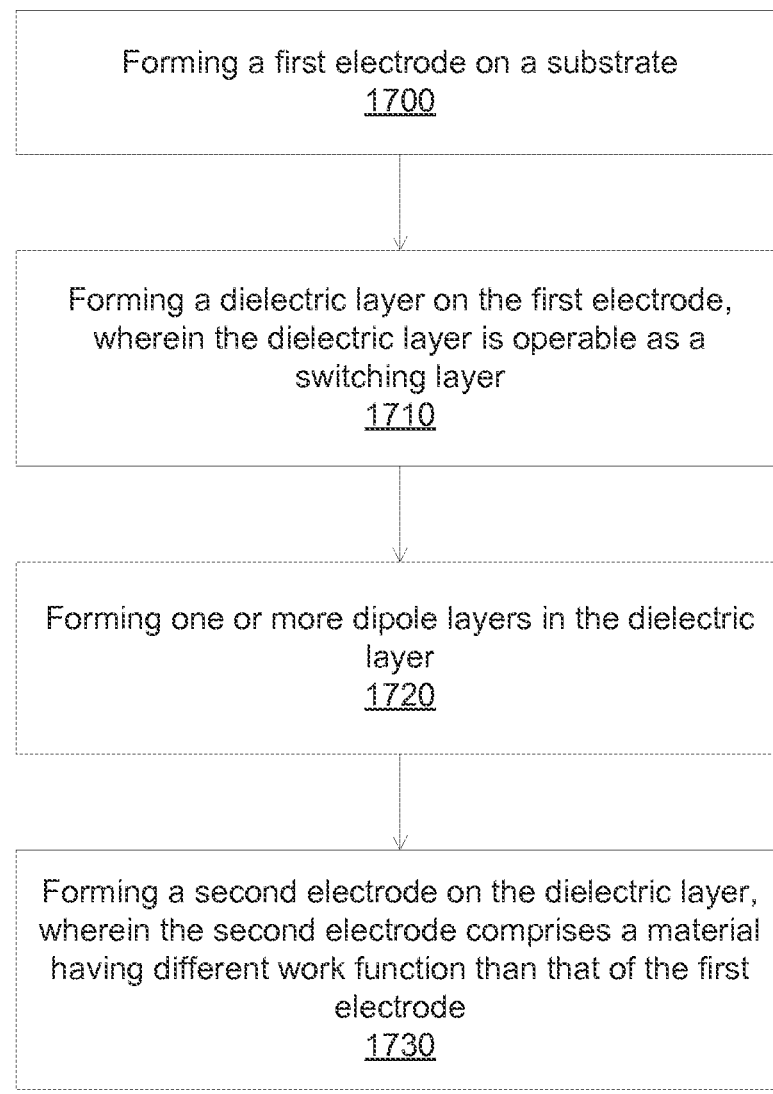
FIG. 17 illustrates a flowchart for forming a memory element according to some embodiments.

FIG. 17 illustrates a flowchart for forming a memory element according to some embodiments. The described flowchart is a general description of techniques used to form the memory element described above. The flowchart describes techniques for forming a memory element generally including two electrodes and one or more dielectric layers disposed therebetween. The dielectric layers can include charged layers or dipole layers to generate internal electric field. Although certain processing techniques and specifications are described, it is understood that various other techniques and modifications of the techniques described herein may also be used.

In operation 1700, a first electrode layer is formed. The first electrode layer can be formed on a substrate, for example, a silicon substrate that may include one or more layers already formed thereon. In some embodiments, the first layer can be a polysilicon layer or a metal containing layer. For example, the first layer can be a highly doped polysilicon layer that is formed using a conventional chemical vapor deposition (CVD) or atomic layer deposition (ALD) type polysilicon deposition technique. In some cases, an optional native oxide layer removal step may be performed after forming the first layer by use of a wet chemical processing technique, or conventional dry clean process that is performed in a plasma processing chamber. It should be noted that the first layer may be provided on a substrate that may have other devices, such as a current selector device, and the electrode formed thereon as well. Alternatively, in the case where no other device is provided, the first layer can be the bottom electrode. The first electrode layer can include materials having high work function, such as Pt, Au, Ag, W, $MoO_2$, $MoSi_xO_y$, or their alloys. The first electrodes can include materials having medium work function, such as TiN, Al, or their alloys. The first electrodes can include materials having low work function, such as Mg, Hf, Zr, Eu, La, or their alloys. The first electrode layer can be formed using PVD or other processes. For example, the first electrode can be sputtered by bombarding a metal target at 150-500 W with a pressure of 2-10 mTorr for a deposition rate of approximately 0.5-5 Å/s. These specifications are given as examples, the specifications can vary greatly depending on the material to be deposited, the tool used to deposit the material, and the desired speed of deposition. The duration of the bombardment can determine the thickness of the electrode. Other processing techniques, such as ALD, pulsed layer deposition (PLD), CVD, evaporation, etc. can also be used to deposit the first electrode. In some embodiments, the first electrode is in contact with one of the signal lines. The first electrode may have any thickness, for example between about 5 nm and about 500 nm thick.

In operation 1710, a dielectric layer can be formed on the first electrode. The dielectric layer can be operable as a switching layer. The dielectric layer can include, for example, $ZrO_2$, $HfO_2$, $Al_2O_3$, $TiO_2$, or ZnO. The thickness of the dielectric layer can be between 1 nm and 10 nm. An optional treatment can be performed after depositing the dielectric layer. The treatment can include a plasma treatment or a high temperature treatment in an oxidizing or reducing ambient. For example, the treatment can include a rapid thermal oxidation at 300 C. in oxygen ambient. The treatment can be performed in-situ after the deposition of the first electrode layer. The treatment can include an oxygen radical anneal, e.g., plasma anneal in an oxygen ambient.

In some embodiments, the dielectric layer can be deposited by a PVD or ALD process. For example, an ALD process can include $O_3$ oxidant, at about 250-300 C. deposition temperature, using tetrakis (ethylmethylamino) zirconium (TEMAZ), Tris (dimethylamino) cyclopentadienyl Zirconium, tetrakis (ethylmethylamino) hafnium (TEMAHf), tetrakis (dimethylamido) hafnium (TDMAHf) precursors.

In operation 1720, one or more dipole layers can be formed in the dielectric layer. The dipole layers can be formed during the deposition of the dielectric layer, and/or can be formed during a post treatment of the deposited dielectric layer. For example, a different precursor can be used during an ALD deposition of the dielectric layer to form a doping layer in the dielectric layer. Alternatively, a different target can be used to sputter deposit a doping layer within the dielectric layer. An optional treatment can be performed after forming the dipole layers. The treatment can include a plasma treatment or a high temperature treatment. For example, the treatment can include a rapid thermal process at 300 C. in an oxidizing or reducing ambient.

In operation 1730, a second electrode layer is formed on the dielectric layer. The second electrode layer can include materials having high work function, such as Pt, Au, Ag, W, $MoO_2$, $MoSi_xO_y$, or their alloys. The second electrode can include materials having medium work function, such as TiN, Al, or their alloys. The second electrodes can include materials having low work function, such as Hf, Zr, Eu, La, or their alloys. The second electrode material is chosen to provide a work function difference with the first electrode, for example, at greater than 0.3 eV or greater than 1 eV. The second electrode can have any thickness, for example between about 5 nm and about 500 nm thick.

Figure 18:
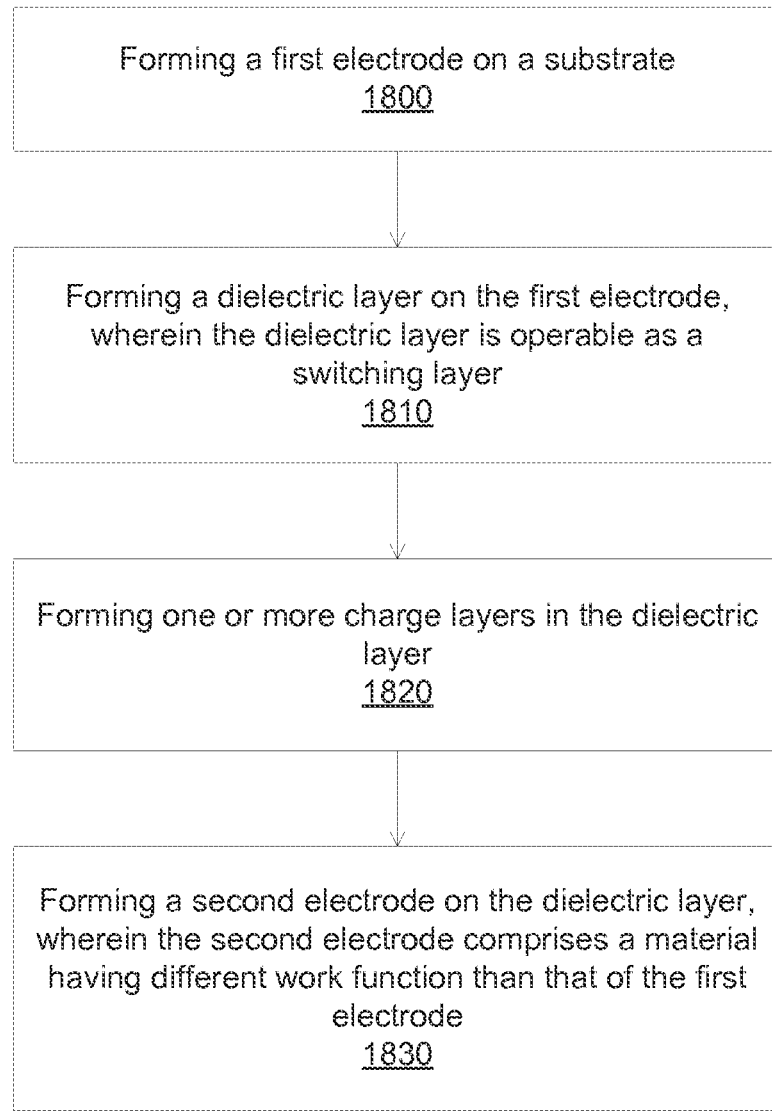
FIG. 18 illustrates a flowchart for forming a memory element according to some embodiments.

FIG. 18 illustrates a flowchart for forming a memory element according to some embodiments. The flowchart describes techniques for forming a memory element generally including two electrodes and one or more dielectric layers disposed therebetween. The dielectric layers can include one or more charge layers within the dielectric layer to generate internal electric field.

In operation 1800, a first electrode layer is formed. The first electrode layer can be formed on a substrate, for example, a silicon substrate that may include one or more layers already formed thereon. In operation 1810, a dielectric layer can be formed on the first electrode. The dielectric layer can be operable as a switching layer. The dielectric layer can include, for example, $ZrO_2$, $HfO_2$, $Al_2O_3$, $TiO_2$, or ZnO. The thickness of the dielectric layer can be between 1 nm and 10 nm. An optional treatment can be performed after depositing the dielectric layer. The treatment can include a plasma treatment or a high temperature treatment in an oxidizing or reducing ambient. For example, the treatment can include a rapid thermal oxidation at 300 C. in oxygen ambient. The treatment can be performed in-situ after the deposition of the first electrode layer. The treatment can include an oxygen radical anneal, e.g., plasma anneal in an oxygen ambient.

In operation 1820, one or more charge layers can be formed in the dielectric layer. The charge layers can be formed during the deposition of the dielectric layer, and/or can be formed during a post treatment of the deposited dielectric layer. For example, a different precursor can be used during an ALD deposition of the dielectric layer to form a charged layer in the dielectric layer. Alternatively, a different target can be used to sputter deposit a charged layer within the dielectric layer. An optional treatment can be performed after forming the charged layers. The treatment can include a plasma treatment or a high temperature treatment in an oxidizing or reducing ambient.

In operation 1830, a second electrode layer is formed on the dielectric layer. The second electrode material is chosen to provide a work function difference with the first electrode, for example, at greater than 0.5 eV or greater than 1 eV.

Figure 19:
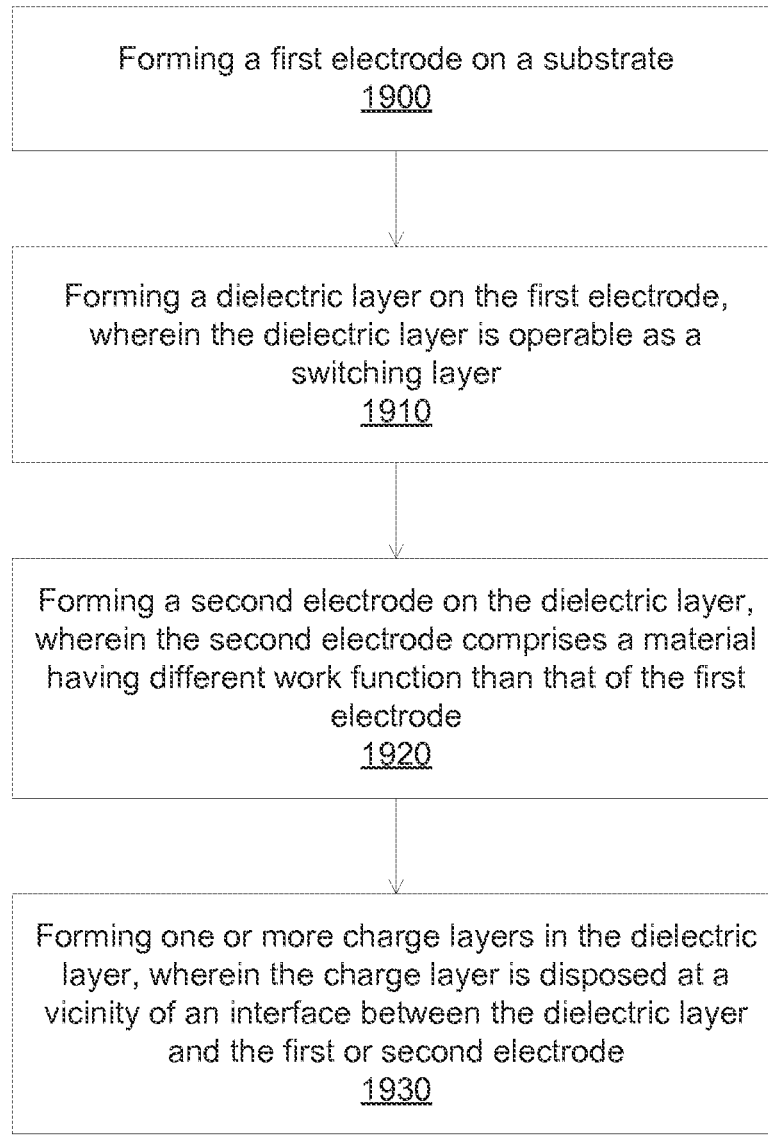
FIG. 19 illustrates a flowchart for forming a memory element according to some embodiments.

FIG. 19 illustrates a flowchart for forming a memory element according to some embodiments. The flowchart describes techniques for forming a memory element generally including two electrodes and one or more dielectric layers disposed therebetween. The dielectric layers can include one or more charged layers at the interface with the electrodes to generate internal electric field.

In operation 1900, a first electrode layer is formed. The first electrode layer can be formed on a substrate, for example, a silicon substrate that may include one or more layers already formed thereon. In operation 1910, a dielectric layer can be formed on the first electrode. The dielectric layer can be operable as a switching layer. The dielectric layer can include, for example, $ZrO_2$, $HfO_2$, $Al_2O_3$, $TiO_2$, or ZnO. The thickness of the dielectric layer can be between 1 nm and 10 nm. An optional treatment can be performed after depositing the dielectric layer. The treatment can include a plasma treatment or a high temperature treatment in an oxidizing or reducing ambient. For example, the treatment can include a rapid thermal oxidation at 300 C. in oxygen ambient. The treatment can be performed in-situ after the deposition of the first electrode layer. The treatment can include an oxygen radical anneal, e.g., plasma anneal in an oxygen ambient.

In operation 1920, a second electrode layer is formed on the dielectric layer. The second electrode material is chosen to provide a work function difference with the first electrode, for example, at greater than 0.5 eV or greater than 1 eV.

In operation 1930, one or more charged layers can be formed in the dielectric layer at the vicinity of the interface with the first or second electrode. The charged layers can be formed during the deposition of the dielectric layer, and/or can be formed during a post treatment of the deposited dielectric layer. An optional treatment can be performed after forming the charge layers. The treatment can include a plasma treatment or a high temperature treatment in an oxidizing or reducing ambient.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method to form a resistive memory cell, the method comprising
    forming a first electrode having a first work function;
    forming a dielectric layer on the first electrode,
        wherein the dielectric layer is operable as a switching layer;
    forming at least one charged layer within the dielectric layer;
        wherein the at least one charged layer is formed by substituting one or more
        precursors of a deposition process used to form the dielectric layer; and
    forming a second electrode on the dielectric layer,
        wherein the second electrode has a second work function, and
        wherein the first work function is different from the second work function.

2. The method as in claim 1, wherein a work function of the first electrode and a work function of the second electrode differ by at least 1 eV.

3. The method as in claim 1, wherein the at least one charged layer is formed by alloying a portion of the dielectric layer.

4. The method as in claim 1, wherein the at least one charged layer comprises two adjacent charged layers of opposite polarities forming a dipole layer.

5. The method as in claim 4, wherein the two adjacent charged layers directly interface each other.

6. The method as in claim 4, wherein the two adjacent charged layers are separated by between about 0.3 nm and 3 nm.

7. The method as in claim 1, wherein the at least one charged layer comprises an element having lower valence than that of a metal element of the dielectric layer.

8. The method as in claim 7, wherein the element having lower valence than that of the metal element of the dielectric layer comprises greater than 10 at % of substitution within the dielectric layer.

9. The method as in claim 1, wherein the at least one charged layer comprises an element having a lower valence than that of oxygen.

10. The method as in claim 9, wherein the element having lower valence than that of oxygen comprises greater than 30 at % of substitution within the dielectric layer.

11. The method as in claim 1, wherein the at least one charged layer comprises an element having a higher valence than that of oxygen.

12. The method as in claim 11, wherein the element having higher valence than that of oxygen comprises greater than 30 at % of substitution within the dielectric layer.

13. The method as in claim 1, wherein the at least one charged layer comprises a charged layer located at a distance of less than 3 nm from an interface of the dielectric layer and the first electrode or an interface of the dielectric layer and the second electrode.

14. The method as in claim 1, wherein the at least one charged layer can be between 5% and 50% of a total thickness of the dielectric layer.

15. The method as in claim 1, wherein the dielectric layer is formed by an atomic layer deposition process utilizing one or more precursors.

16. The method as in claim 1, further comprising treating the dielectric layer using one of a rapid thermal oxidation at 300 C. in oxygen ambient or a plasma anneal in an oxygen ambient.

17. The method as in claim 1, wherein the second electrode comprises one $MoO_2$ or $MoSi_xO_y$.

18. The method as in claim 1, wherein the dielectric layer comprises one of $ZrO_2$, $HfO_2$, $Al_2O_3$, $TiO_2$, or $ZnO$.

19. The method as in claim 1, wherein a thickness of the dielectric layer can be between 1 nm and 10 nm.

* * * * *